(12) United States Patent
Nishiwaki

(10) Patent No.: US 9,978,884 B2
(45) Date of Patent: May 22, 2018

(54) SEMICONDUCTOR DEVICE

(71) Applicant: KABUSHIKI KAISHA TOSHIBA, Minato-ku, Tokyo (JP)

(72) Inventor: Tatsuya Nishiwaki, Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days. days.

(21) Appl. No.: 15/448,057

(22) Filed: Mar. 2, 2017

(65) Prior Publication Data

US 2018/0076338 A1 Mar. 15, 2018

(30) Foreign Application Priority Data

Sep. 13, 2016 (JP) .................. 2016-178572

(51) Int. Cl.
*H01L 29/94* (2006.01)
*H01L 27/06* (2006.01)
*H01L 29/93* (2006.01)

(52) U.S. Cl.
CPC ........ *H01L 29/945* (2013.01); *H01L 27/0629* (2013.01); *H01L 29/93* (2013.01)

(58) Field of Classification Search
CPC .... H01L 29/945; H01L 27/0629; H01L 29/93
See application file for complete search history.

(56) References Cited

U.S. PATENT DOCUMENTS 8,410,546 B2 4/2013 Kawaguchi et al.

FOREIGN PATENT DOCUMENTS

JP 2010-206012 A 9/2010
JP 5476737 B2 4/2014

*Primary Examiner* — Walter H Swanson
(74) *Attorney, Agent, or Firm* — Foley & Lardner LLP

(57) ABSTRACT

A semiconductor device includes an anode electrode, a first semiconductor region of a first conductivity type, a second semiconductor region of a second conductivity type, a conductive portion and a cathode electrode. The first semiconductor region is electrically connected to the anode electrode. The second semiconductor region is provided on the first semiconductor region. The conductive portion is provided in the first semiconductor region and the second semiconductor region with an insulating layer interposed between the conductive portion and the first and second semiconductor regions. The cathode electrode is electrically connected to the conductive portions and is electrically isolated from the second semiconductor region.

2 Claims, 18 Drawing Sheets

SEMICONDUCTOR DEVICE

CROSS-REFERENCE TO RELATED APPLICATION

This application claims the benefit of and priority to Japanese Patent Application No. 2016-178572, filed Sep. 13, 2016, the entire contents of which are incorporated herein by reference.

FIELD

Embodiments described herein relate generally to a semiconductor device.

BACKGROUND

Recently, for example, a semiconductor device having a snubber function is used to prevent noise in an electric circuit. When such a semiconductor device is connected, the power loss in the electric circuit may increase due to charging and discharging of a capacitor.

SUMMARY

In some embodiments according to one aspect, a semiconductor device may include an anode electrode, a first semiconductor region of a first conductivity type, a second semiconductor region of a second conductivity type, a conductive portion and a cathode electrode. The first semiconductor region may be electrically connected to the anode electrode. The second semiconductor region may be provided on the first semiconductor region. The conductive portion may be provided in the first semiconductor region and the second semiconductor region with an insulating layer interposed between the conductive portion and the first and second semiconductor regions. The cathode electrode may be electrically connected to the conductive portions and electrically isolated from the second semiconductor region.

In some embodiments according to another aspect, a semiconductor device may include a cathode electrode, a first semiconductor region of a second conductivity type, a second semiconductor region of a first conductivity type, conductive portions and an anode electrode. The first semiconductor region may be electrically connected to the cathode electrode. The second semiconductor region may be provided on the first semiconductor region. The conductive portions may be provided in the first semiconductor region and the second semiconductor region with an insulating layer interposed between the conductive portions and the first and second semiconductor regions. The anode electrode may be electrically connected to the conductive portions.

In some embodiments according to still another aspect, a semiconductor device may include a first semiconductor region of a first conductivity type, a second semiconductor region of a second conductivity type, conductive portions, a cathode electrode and an anode electrode. The second semiconductor region may be provided on a portion of the first semiconductor region. The conductive portions may be provided on the other portion of the first semiconductor region with an insulating layer interposed between the conductive portions and the other portion of the first semiconductor region. The cathode electrode may be electrically connected to the second semiconductor region. The anode electrode may be electrically connected to the conductive portions.

In some embodiments according to another aspect, a semiconductor device may include a first semiconductor region of a first conductivity type, a second semiconductor region of a second conductivity type, a third semiconductor region of the first conductivity type, conductive portions, and a fourth semiconductor region of the second conductivity type, a fifth semiconductor region of the first conductivity type, a gate electrode, and a first electrode. The second semiconductor region may be provided on a portion of the first semiconductor region. The third semiconductor region may be provided on the second semiconductor region. The conductive portions may be provided in the second semiconductor region and the third semiconductor region with a first insulating layer interposed between the conductive portions and the second and third semiconductor regions. The fourth semiconductor region may be provided on the other portion of the first semiconductor region. The fifth semiconductor region may be provided on the fourth semiconductor region. The gate electrode may face the fourth semiconductor region with a gate insulating layer interposed between the gate electrode and the fourth semiconductor region. The first electrode may be provided on the fourth semiconductor region and the fifth semiconductor region and is electrically connected to the fourth semiconductor region, the fifth semiconductor region, and the conductive portions.

Other aspects and embodiments of the disclosure are also encompassed. The foregoing summary and the following detailed description are not meant to restrict the disclosure to any particular embodiment but are merely meant to describe some embodiments of the disclosure.

DETAILED DESCRIPTION

Figure 1:
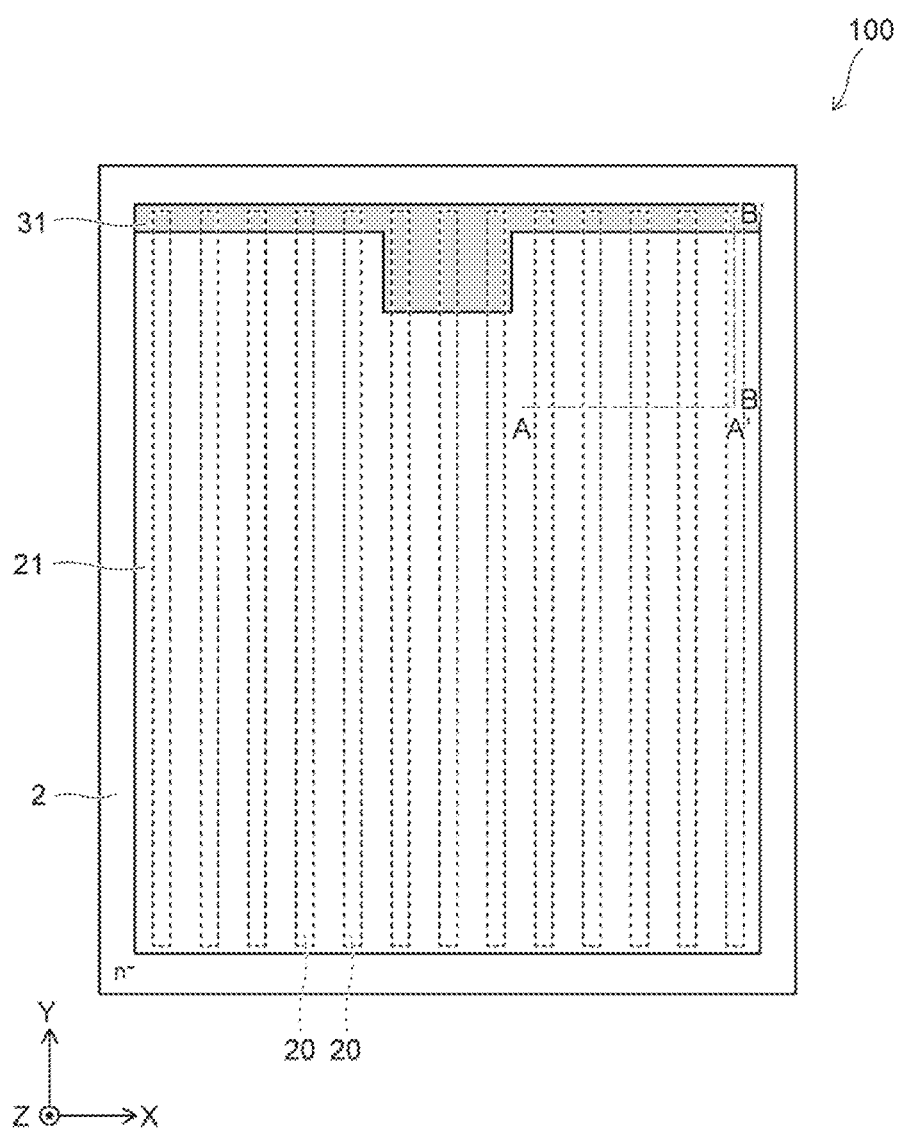
FIG. 1 is a plan view of a semiconductor device according to some embodiments.

An example embodiment provides a semiconductor device capable of preventing power loss.

According to one embodiment, a semiconductor device may include an anode electrode, a first semiconductor region of p-type, a second semiconductor region of n-type, a conductive portion, and a cathode electrode. The first semiconductor region may be electrically connected to the anode electrode. The second semiconductor region may be provided on the first semiconductor region. The conductive portion may be provided in the first semiconductor region and the second semiconductor region with interposing an insulating layer. The cathode electrode may be electrically connected to the conductive portion, and may be electrically isolated from the second semiconductor region.

In the following, embodiments of the present disclosure will be described with reference to the drawings.

The drawings are given schematically and conceptually, and a relation between thickness and width of the respective portions and a ratio of sizes between the portions are not illustrated in the exactly actual size. Even in a case where the same portion is illustrated, the dimension and the ratio may be differently illustrated in the drawings.

In the present disclosure and the drawings, corresponding elements and the like are given the same reference signs as the element described already, and the detailed description will be appropriately omitted.

In the following explanation, the notations of $p^+$, p, and $p^-$ show relative magnitudes in impurity (or a dopant) concentration in a particular conductivity type (e.g., a first conductivity type). Similarly, the notations of $n^+$, n, and $n^-$ show relative magnitudes in impurity concentration in another conductivity type (e.g., a second conductivity type). In other words, the notation denoted by "+" means that the impurity concentration is relatively higher than that not attached with any one of "+" and "−", and the notation denoted by "−" means that the impurity concentration is relatively lower than that not attached with any one of them.

In the respective embodiments described below, the p-type and the n-type semiconductor regions may be reversely provided.

FIG. 1 is a plan view of a semiconductor device 100 according to some embodiments.

Figure 2:
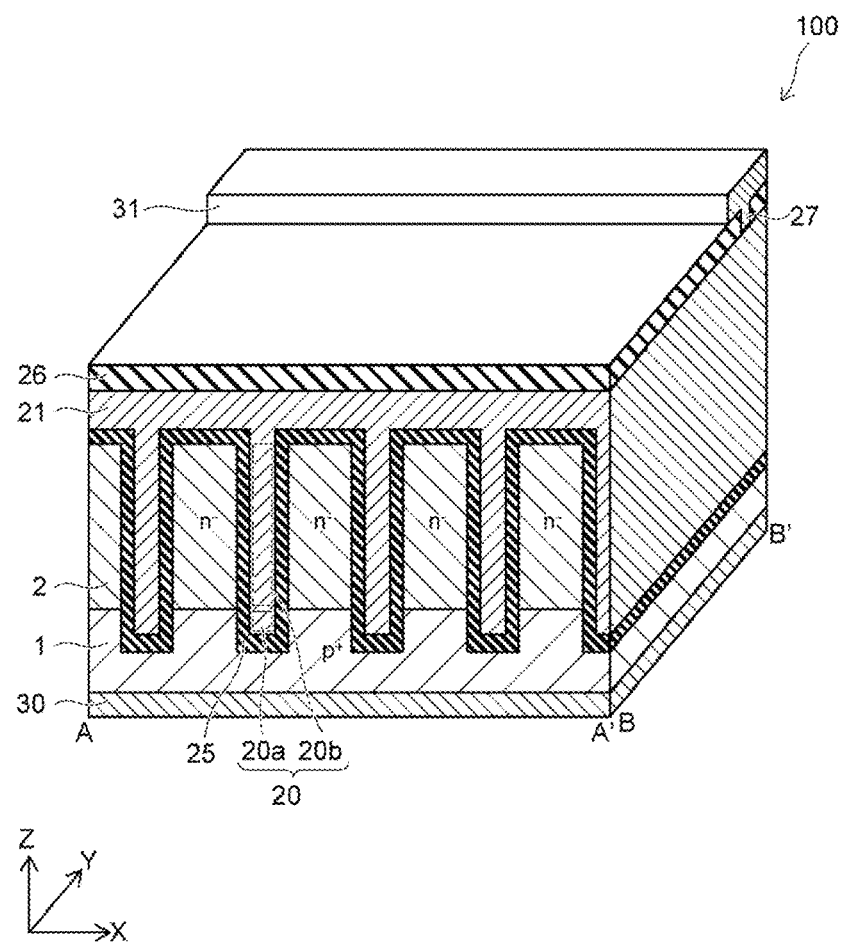
FIG. 2 is a perspective sectional view taken along lines A-A' and B-B' in FIG. 1.

FIG. 2 is a perspective sectional view taken along lines A-A' and B-B' in FIG. 1.

In FIG. 1, an insulating layer 26 is not illustrated, and conductive portions 20 are represented by broken lines.

In some embodiments, as illustrated in FIG. 1 and FIG. 2, the semiconductor device 100 includes a $p^+$ type semiconductor region 1, an $n^-$ type semiconductor region 2, conductive portions 20, an insulating layer 25, an insulating layer 26, a connection portion 27, an anode electrode 30, and a cathode electrode 31.

In some embodiments, in two electrodes, one electrode is set to a higher potential and is referred to as the anode electrode, and the other electrode is set to a lower potential and is referred to as the cathode electrode.

An XYZ orthogonal coordinate system will be used in the explanation of the respective embodiments. A direction extending toward the $p^+$ type semiconductor region 1 to the $n^-$ type semiconductor region 2 is defined as a Z direction (e.g., as a first direction), and two directions perpendicular to the Z direction are defined as an X direction and a Y direction, which are orthogonal to each other. By perpendicular or orthogonal, the terms can refer to precisely 90° as well as a range of variation of less than or equal to ±5° relative to 90°, such as less than or equal to ±4°, less than or equal to ±3°, less than or equal to ±2°, or less than or equal to ±1°. In the description of some embodiments, an element provided "on" another element can encompass cases where the former element is directly on (e.g., in physical contact with) the latter element, as well as cases where one or more intervening elements are located between the former element and the latter element. In the description of some embodiments, an element provided "beneath" another element can encompass cases where the former element is directly beneath (e.g., in physical contact with) the latter element, as well as cases where one or more intervening elements are located between the former element and the latter element.

As illustrated in FIG. 2, the anode electrode 30 is provided on a rear surface of the semiconductor device 100.

In some embodiments, the $p^+$ type semiconductor region 1 is provided on the anode electrode 30, and is electrically connected to the anode electrode 30.

In some embodiments, the $n^-$ type semiconductor region 2 is provided on the $p^+$ type semiconductor region 1.

In some embodiments, the conductive portion 20 is provided in the $p^+$ type semiconductor region 1 and the $n^-$ type semiconductor region 2 with interposing the insulating layer 25. In some embodiments, the insulating layer 25 is interposed between (1) the conductive portion 20 and (2) the $p^+$ type semiconductor region 1 and the $n^-$ type semiconductor region 2. In some embodiments, the conductive portion 20 includes a first portion 20a and a second portion 20b. In some embodiments, in the X direction, the first portion 20a faces the $p^+$ type semiconductor region 1 with interposing the insulating layer 25 (e.g., between the first portion 20a and the $p^+$ type semiconductor region 1), and the second portion 20b faces then $n^-$ type semiconductor region 2 with interposing the insulating layer 25 (e.g., between the second portion 20b and the $n^-$ type semiconductor region 2). In some embodiments, a length of the first portion 20a in the Z direction is shorter than a length of the second portion 20b in the Z direction.

As illustrated in FIG. 1, in some embodiments, the plurality of conductive portions 20 are provided in the X direction, and extend in the Y direction, respectively.

As illustrated in FIG. 2, in some embodiments, a conductive portion 21 is provided on the plurality of conductive portions 20, and is connected to each of the conductive portions 20. In some embodiments, the conductive portion 21 is provided on the $n^-$ type semiconductor region 2 with interposing the insulating layer 25. In some embodiments, the conductive portions 20 may be provided integrally with the conductive portions 21.

In some embodiments, the insulating layer 26 is provided on the conductive portion 21.

In some embodiments, the cathode electrode 31 is provided on the insulating layer 26, and is electrically connected to the conductive portion 21 via the connection portion (e.g., contact plug) 27 formed in the insulating layer 26.

An example of a material of each component will be described below.

In some embodiments, the $p^+$ type semiconductor region 1 and then $n^-$ type semiconductor region 2 contain a semiconductor material, for example, silicon or silicon carbide. In some embodiments, when the semiconductor material such as the silicon is used, arsenic, phosphorus, or antimony can be used as an n-type impurity. Boron can be used as a p-type impurity.

In some embodiments, the conductive portions 20 and 21 contain a conductive material such as polysilicon.

In some embodiments, the insulating layers 25 and 26 contain an insulating material such as silicon oxide.

In some embodiments, the connection portion 27, the anode electrode 30, and the cathode electrode 31 contain a metal such as aluminum.

Here, operation and effects of the semiconductor device 100 according to some embodiments (e.g., the embodiments illustrated in FIG. 1 and FIG. 2) will be described with reference to FIGS. 3A to 3C.

Figure 3A:
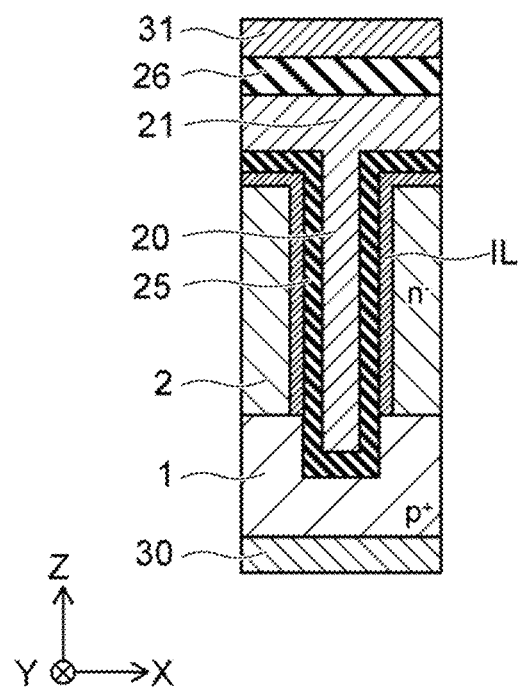
FIG. 3A is a sectional view illustrating a portion of a semiconductor device.

FIG. 3A is a sectional view illustrating a portion of the semiconductor device 100. FIG. 3B is a graph illustrating a relation between a voltage applied to the semiconductor device 100 and a capacitance. FIG. 3C is an electric circuit diagram illustrating an example of a circuit for which a snubber circuit is used.

In some embodiments, in the semiconductor device 100, a capacitor is configured with the p$^+$ type semiconductor region 1 and the n$^-$ type semiconductor region 2, the conductive portion 20, and the insulating layer 25. In some embodiments, the p$^+$ type semiconductor region 1 is electrically connected to the anode electrode 30, and the conductive portion 20 is electrically connected to the cathode electrode 31. For this reason, when a voltage which is positive with respect to the cathode electrode 31 is applied to the anode electrode 30, due to a potential difference between the p$^+$ type semiconductor region 1 and the conductive portion 20, electrons in the region of n$^-$ type semiconductor region 2 close to the insulating layer 25 are depleted, and thus a hole inversion layer IL is formed as illustrated in FIG. 3A. Thus, the amount of charges to be accumulated in the capacitor increases, and the capacitance between the anode electrode 30 and the cathode electrode 31 increases.

Figure 3B:
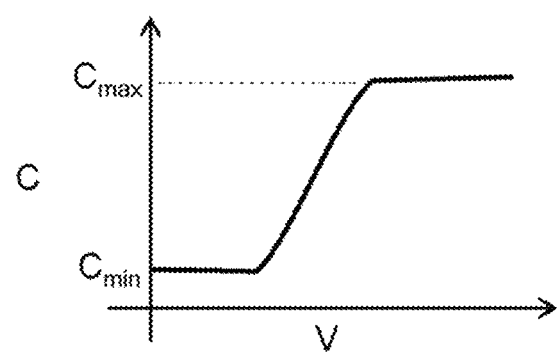
FIG. 3B is a graph illustrating a relation between a voltage applied to the semiconductor device and a capacitance.

FIG. 3B illustrates a relation between a positive voltage V of the anode electrode 30 with respect to the cathode electrode 31 and the capacitance C between the anode electrode 30 and the cathode electrode 31. In the semiconductor device 100 according to some embodiments, as illustrated in FIG. 3B, as the voltage V increases, the capacitance increases from Cmin to Cmax.

In this way, according to some embodiments (e.g., the embodiments of FIGS. 1-3A), the capacitance of the semiconductor device can be varied according to the voltage applied to the cathode electrode 31 with respect to the anode electrode 30.

An application of the semiconductor device 100 according to some embodiments will be described.

Figure 3C:
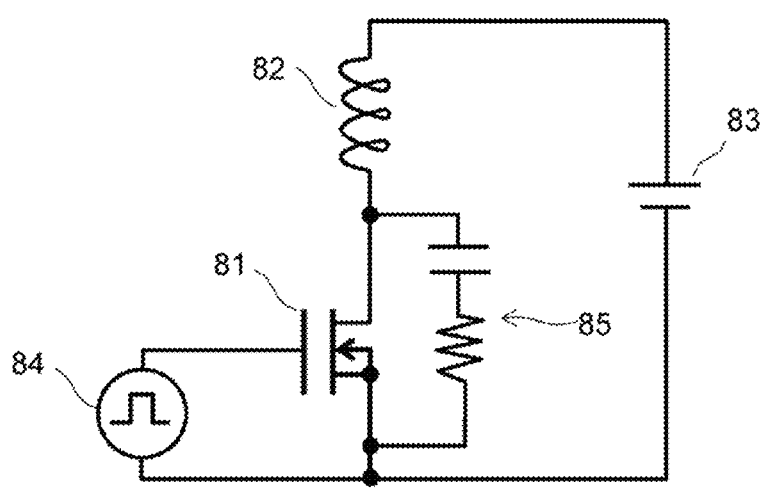
FIG. 3C is an electric circuit diagram illustrating an example of a circuit for which a snubber circuit is used.

In some embodiments, in a circuit illustrated in FIG. 3C, a MOSFET 81, inductance 82, power supply 83, a gate signal source 84, and a snubber circuit 85 are used. In the circuit illustrated in FIG. 3C, in some embodiments, when the MOSFET 81 is switched from an ON-state to an OFF-state, a large surge voltage is instantaneously generated at a drain electrode side due to induced electromotive force of the inductance 82. In some embodiments, when the surge voltage is generated, a voltage (e.g., drain voltage) between a source electrode and a drain electrode vibrates. In some embodiments, the snubber circuit 85 is connected between the drain electrode and the source electrode, and thus the vibration of the drain voltage can be prevented.

However, when the snubber circuit 85 is connected between the drain electrode and the source electrode, since the capacitor of the snubber circuit 85 is charged and discharged at the time of switching of the MOSFET 81, power loss may increase. In addition, as the capacitance of the capacitor is larger, the vibration of the drain voltage can be prevented. However, as the capacitance of the capacitor is larger, the power loss due to the capacitor may increase.

In this regard, as described above, the semiconductor device 100 according to some embodiments (e.g., the embodiments of FIGS. 1-3A) has a larger capacitance as the drain voltage increases. Accordingly, when the semiconductor device 100 according to some embodiments (e.g., the embodiments of FIGS. 1-3A) is used as the snubber circuit 85, the capacitance is small in the ON-state in which the drain voltage is low, and the capacitance C becomes large in the OFF-state in which the drain voltage is high. That is, although the capacitance increases with the rise of the drain voltage during the turning-off at which the surge voltage is generated, the capacitance decreases with the lowering of the drain voltage during the turning-on.

For this reason, when the semiconductor device 100 according to some embodiments (e.g., the embodiments of FIGS. 1-3A) is used as the snubber circuit 85, the vibration of the drain voltage can be prevented, and the amount of charges to be charged and discharged to/from the capacitor becomes small, as compared to a case where a capacitor having a constant capacitance with respect to a voltage is used for a snubber circuit. Thus, the power loss due to the snubber circuit 85 can be prevented.

More examples of the semiconductor device 100 according to some embodiments will be described below.

In some embodiments, when the plurality of conductive portions 20 are provided in the p$^+$ type semiconductor region 1 and the n$^-$ type semiconductor region 2, the area of the inversion layer IL (see FIG. 3A) is increased, and the capacitance of the capacitor can be increased when the inversion layer IL is formed. That is, the capacitance Cmax illustrated in FIG. 3B can be made larger.

In some embodiments, the length of the first portion 20a in the Z direction is shorter than the length of the second portion 20b in the Z direction and the area of the first portion 20a facing the p$^+$ type semiconductor region 1 is small. With such a configuration, the capacitance of the semiconductor device 100 not formed with the inversion layer IL can be reduced. That is, the capacitance Cmin illustrated in FIG. 3B can be decreased.

In some embodiments, in the circuit illustrated in FIG. 3C, by the increase of the capacitance Cmax, the vibration of the drain voltage can be further prevented when the MOSFET 81 is turned off. In some embodiments, by the decrease of the capacitance Cmin, when the semiconductor device 100 is used as the snubber circuit 85, the amount of charges necessary for charging and discharging the snubber circuit 85 can be further reduced, and the power loss can be further prevented.

Arrangement and shape of the conductive portion 20 can be appropriately changed. For example, a plurality of conductive portions 20 may be provided in the Y direction, and each of the conductive portions may extend in the X direction. In some embodiments, the conductive portions 20 may be provided in a lattice shape along an X-Y plane.

Figure 4:
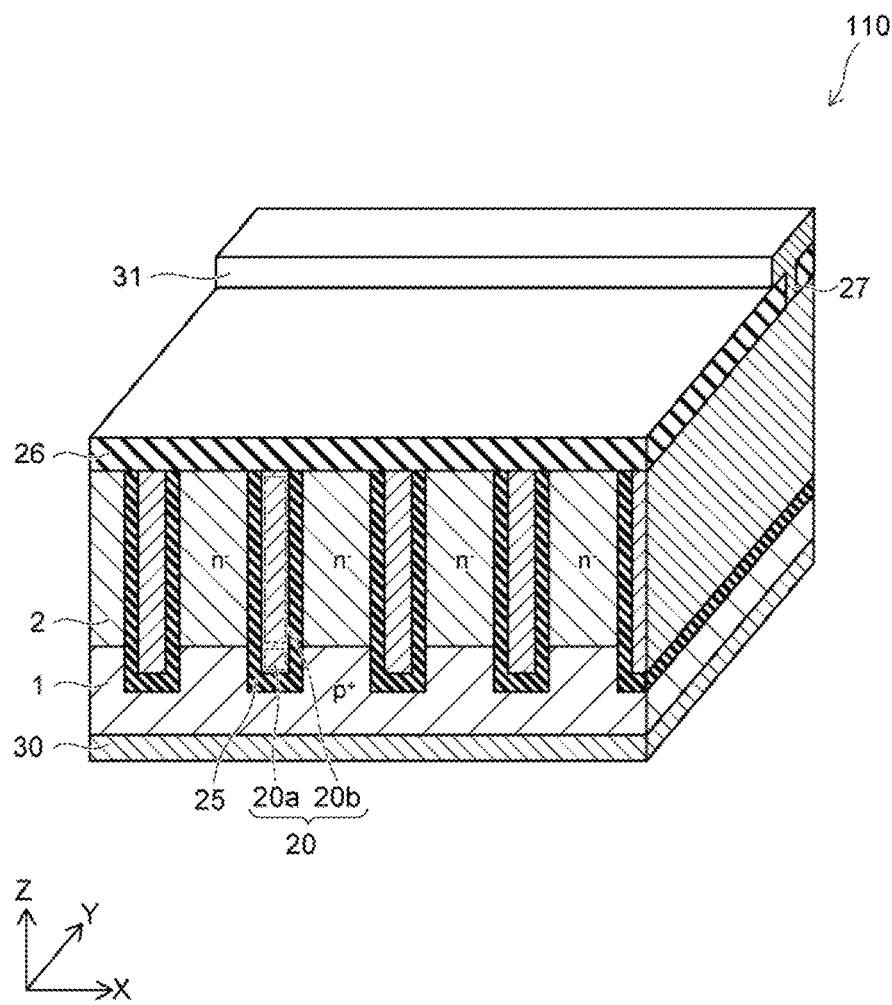
FIG. 4 is a perspective sectional view of a semiconductor device according to some embodiments.

FIG. 4 is a perspective sectional view of a semiconductor device 110 according to some embodiments.

The semiconductor device 110 differs from the semiconductor device 100 in that the conductive portion 21 is not provided.

In some embodiments, in the semiconductor device 110, an upper surface of the conductive portion 20 is covered with the insulating layer 26, and the conductive portion 20 and the cathode electrode 31 are directly connected to each other by the connection portion 27 in the insulating layer 26.

Like the semiconductor device 100 (see FIG. 1 and FIG. 2), the capacitance of the semiconductor device 110 according to some embodiments is also varied according to the voltage applied to the cathode electrode 31 with respect to the anode electrode 30.

According to some embodiments, the conductive portion 21 is not provided, and thus a path of a displacement current flowing toward the cathode electrode 31 from the anode electrode 30 is narrowed, so that an electric resistance between the anode electrode 30 and the cathode electrode 31 can be increased. For this reason, when the semiconductor device according to some embodiments (e.g., the embodiment illustrated in FIG. 4) is used as the snubber circuit, it is possible to increase the electric resistance in the snubber circuit and to prevent instantaneous increase of the drain voltage when a surge voltage is generated.

Figure 5:
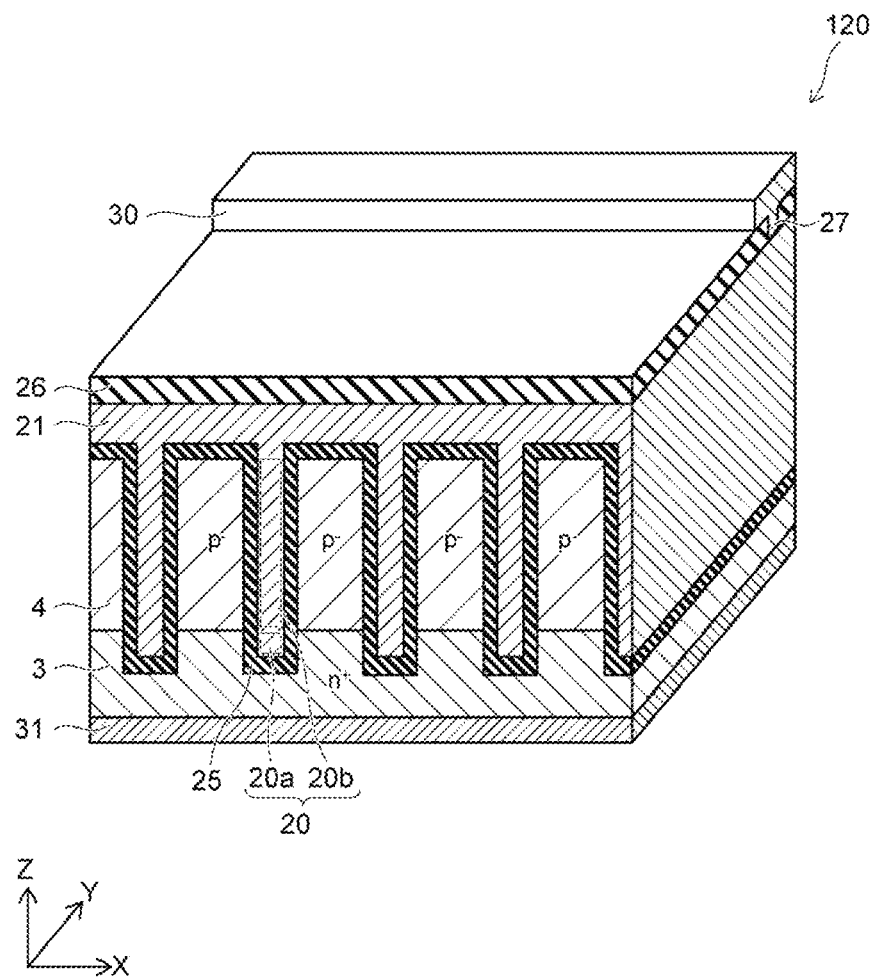
FIG. 5 is a perspective sectional view of a semiconductor device according to some embodiments.

FIG. 5 is a perspective sectional view of a semiconductor device 120 according to some embodiments.

The semiconductor device 120 differs from the semiconductor device 100 in terms of the arrangement of the anode electrode 30 and the cathode electrode 31. In some embodiments, an $n^+$ type semiconductor region 3 and a $p^-$ type semiconductor region 4 are provided instead of the $p^+$ type semiconductor region 1 and the $n^-$ type semiconductor region 2.

In some embodiments, a direction extending toward the $p^-$ type semiconductor region 4 from the $n^+$ type semiconductor region 3 is defined as a Z direction (e.g., as a first direction), and two directions perpendicular to the Z direction are defined as an X direction and a Y direction, which are orthogonal to each other.

In some embodiments, the cathode electrode 31 is provided on a rear surface of the semiconductor device 120.

In some embodiments, the $n^+$ type semiconductor region 3 is provided on the cathode electrode 31, and is electrically connected to the cathode electrode 31.

In some embodiments, the $p^-$ type semiconductor region 4 is provided on the $n^+$ type semiconductor region 3.

In some embodiments, the conductive portion 20 is provided in the $n^+$ type semiconductor region 3 and the $p^-$ type semiconductor region 4 with interposing the insulating layer 25.

In some embodiments, the conductive portion 21 is provided on the plurality of conductive portions 20. In some embodiments, the conductive portion 21 is connected to the plurality of conductive portions 20 and is electrically connected to the anode electrode 30 via the connection portion 27 formed in the insulating layer 26.

In some embodiments, in the semiconductor device 120, when a voltage which is positive with respect to the cathode electrode 31 is applied to the anode electrode 30, an electron inversion layer is formed in the $p^-$ type semiconductor region 4 close to the insulating layer 25. For this reason, like the semiconductor device 100 (see FIG. 1 and FIG. 2), the capacitance of the semiconductor device 120 is also varied according to the voltage applied to the cathode electrode 31 with respect to the anode electrode 30.

In this way, even when the polarity of the electrode connected to the conductive portion 20 is changed, the embodiment illustrated in FIG. 5 can be implemented.

Figure 6A:
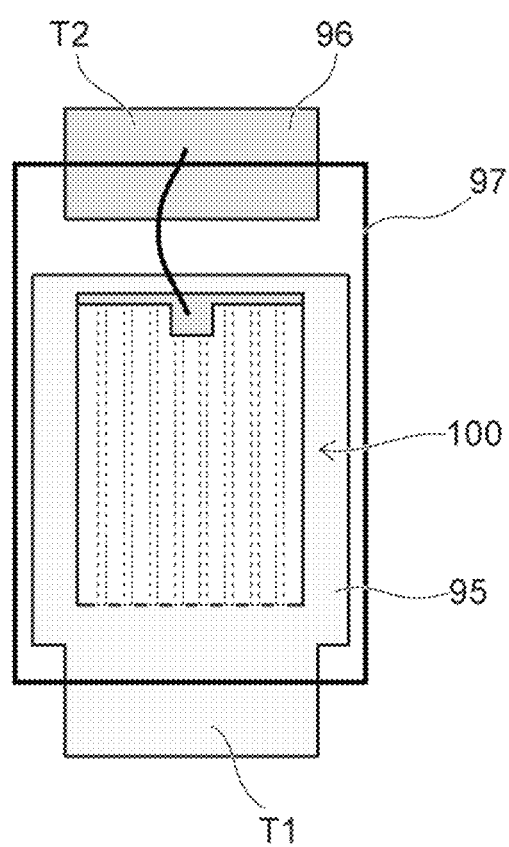
FIG. 6A and FIG. 6B are plan views illustrating a semiconductor package including the semiconductor device according to some embodiments.
Figure 6B:
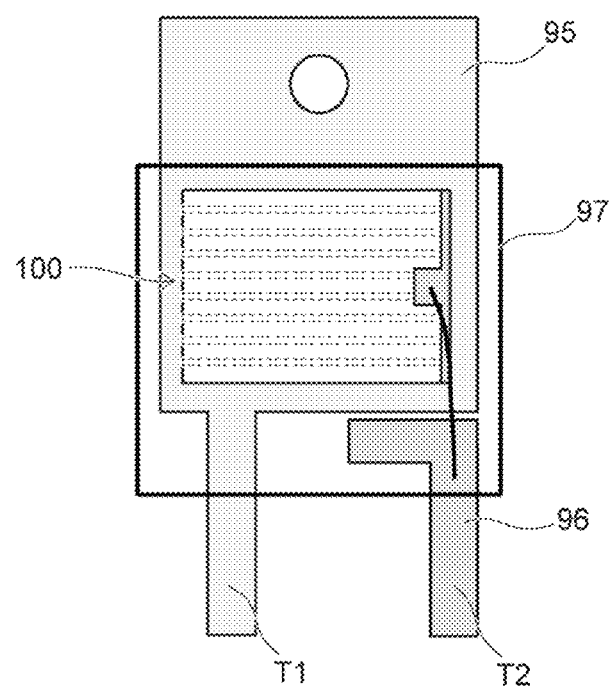

FIG. 6A and FIG. 6B are plan views illustrating a semiconductor package including the semiconductor device 100 according to some embodiments.

In FIG. 6A and FIG. 6B, only an outline of a sealing resin 97 is illustrated.

In some embodiments, in the semiconductor package illustrated in FIG. 6A, the semiconductor device 100 is placed on a metal plate 95 having a terminal T1. In some embodiments, the cathode electrode 31 of the semiconductor device 100 is connected to a metal plate 96 having a terminal T2 by a bonding wire, and the terminals T1 and T2 are led out in directions opposite to each other. In some embodiments, a portion of the metal plate 95, a portion of the metal plate 96, and the semiconductor device 100 are sealed by the sealing resin 97.

In some embodiments, in the semiconductor package illustrated in FIG. 6B, the cathode electrode of the semiconductor device 100 placed on the metal plate 95 is connected to the metal plate 96, and the terminals T1 and T2 are led out in the same direction.

As described above, the semiconductor device according to some embodiments (e.g., the embodiment illustrated in FIG. 6A and FIG. 6B) can be mounted on various semiconductor packages.

Figure 7:
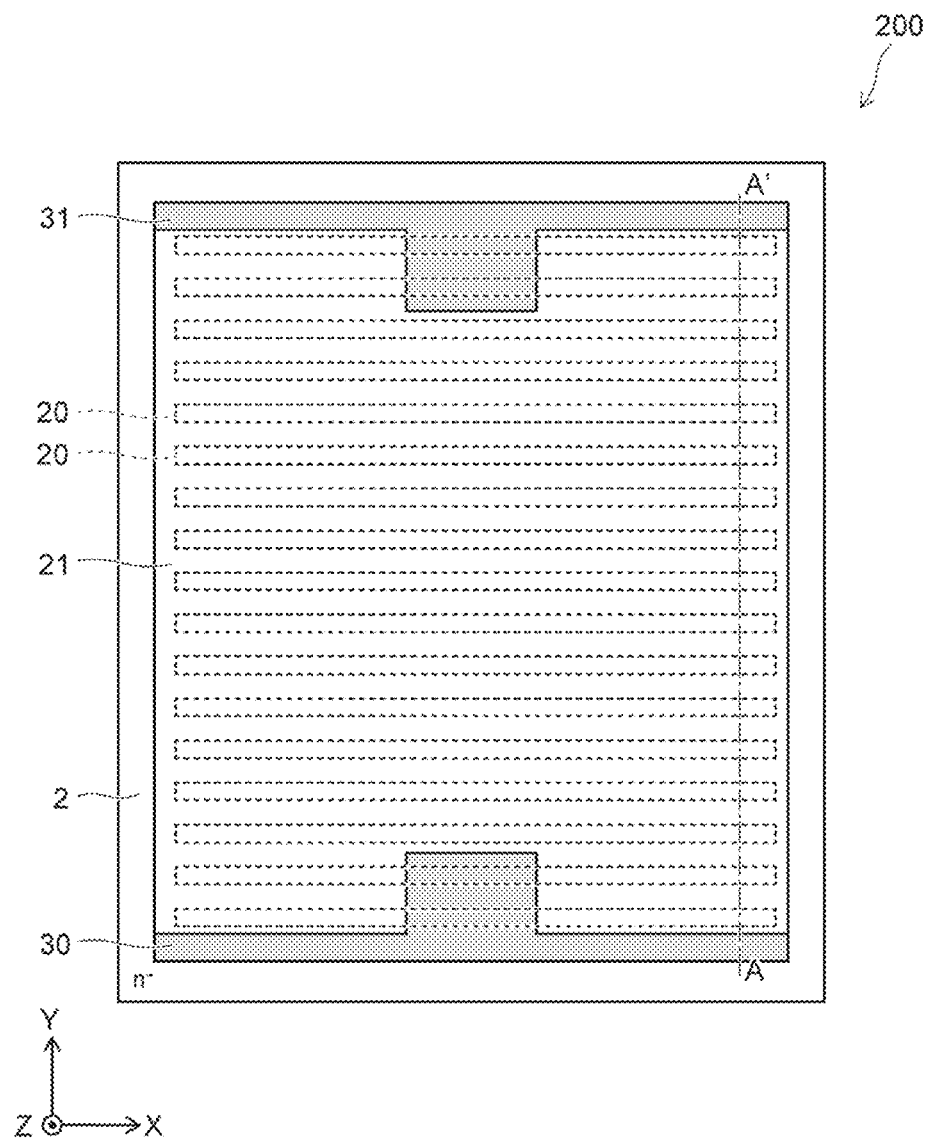
FIG. 7 is a plan view of a semiconductor device according to some embodiments.

FIG. 7 is a plan view of a semiconductor device 200 according to some embodiments.

Figure 8:
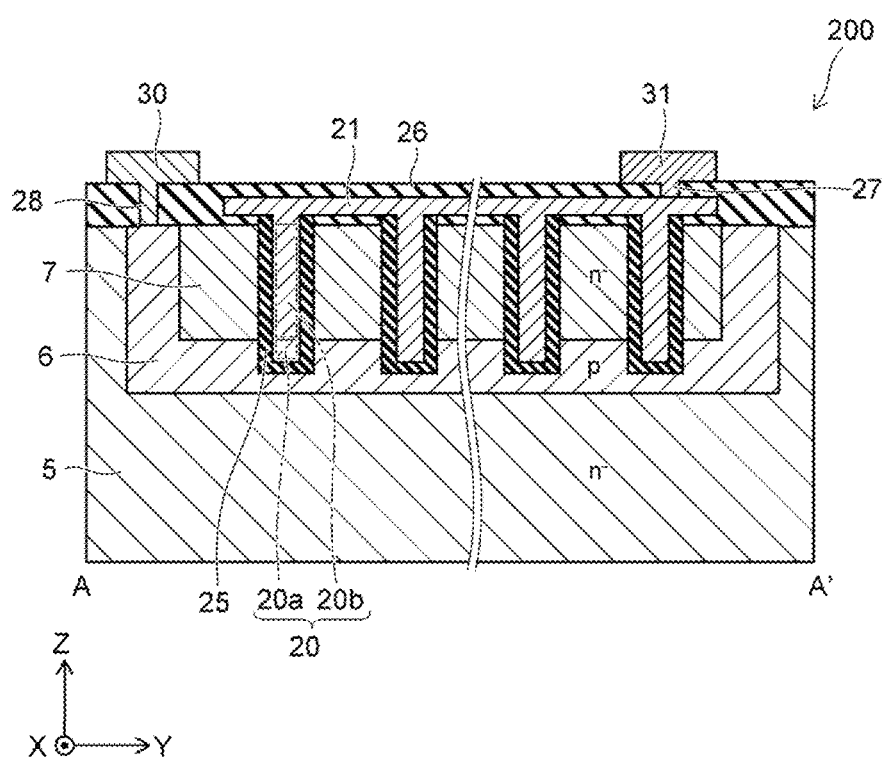
FIG. 8 is a sectional view taken along line A-A' in FIG. 7.

FIG. 8 is a sectional view taken along line A-A' in FIG. 7.

In FIG. 7, an insulating layer 26 is not illustrated, and conductive portions 20 are represented by a broken line.

In some embodiments, the semiconductor device 200 includes an $n^-$ type semiconductor region 5, a p-type semiconductor region 6, an $n^-$ type semiconductor region 7, conductive portions 20, a conductive portion 21, an insulating layer 25, an insulating layer 26, an anode electrode 30, and a cathode electrode 31.

In some embodiments (e.g., the embodiments illustrated in FIG. 7 and FIG. 8), a direction extending toward the p-type semiconductor region 6 from the $n^-$ type semiconductor region 5 is denoted as a Z direction (e.g., as a first direction), and two directions perpendicular to the Z direction are denoted as an X direction and a Y direction, which are orthogonal to each other.

In some embodiments, as illustrated in FIG. 7, the anode electrode 30 and the cathode electrode 31 are provided on an upper surface of the semiconductor device 200.

In some embodiments, as illustrated in FIG. 8, the p-type semiconductor region 6 is provided on a portion of then $n^-$ type semiconductor region 5. In some embodiments, a portion of the p-type semiconductor region 5 extends in the X direction and comes in contact with the insulating layer 25, and the other portion extends in the Z direction and is connected to the connection portion 28.

In some embodiments, the $n^-$ type semiconductor region 7 is provided on the p-type semiconductor region 6. In some embodiments, then $n^-$ type semiconductor region 5 and then $n^-$ type semiconductor region 7 may be connected to each other at a portion which is not illustrated.

In some embodiments, the conductive portion 20 is provided in the $n^-$ type semiconductor region 5 and the p-type semiconductor region 6 with having the insulating layer 25 interposed (e.g., between (1) the conductive portion 20 and (2) the $n^-$ type semiconductor region 5 and the p-type semiconductor region 6). In some embodiments, as illustrated in FIG. 7, the plurality of conductive portions 20 are provided in the Y direction, and extend in the X direction, respectively.

In some embodiments, the conductive portion 21 is provided on the plurality of conductive portions 20, and is connected to each of the conductive portions 20.

In some embodiments, the insulating layer 26 covers the $n^-$ type semiconductor region 5, the p-type semiconductor region 6, the $n^-$ type semiconductor region 7, and the conductive portion 21. In some embodiments, the cathode electrode 31 and the anode electrode 30 are respectively connected to the p-type semiconductor region 6 and the conductive portion 21 via the connection portions 27 and 28 formed on the insulating layer 26.

Like the semiconductor device according to the embodiments illustrated in FIGS. 1-6B, when the voltage which is positive with respect to the cathode electrode 31 is applied to the anode electrode 30, a hole inversion layer is also formed in the $n^-$ type semiconductor region 7 close to the insulating layer 25 in the semiconductor device according to some embodiments (e.g., the embodiments illustrated in FIG. 7 and FIG. 8). For this reason, as the voltage applied to the anode electrode 30 increases, the capacitance between the anode electrode 30 and the cathode electrode 31 can be increased.

In some embodiments, a lower end of the conductive portion 20 may reach the $n^-$ type semiconductor region 5. In some embodiments, although the inversion layer is formed in the $n^-$ type semiconductor region 7 close to the insulating layer 25 due to a potential difference between the conductive portion 20 and the p-type semiconductor region 6 when the positive voltage is applied to the anode electrode 30, the inversion layer is hardly formed in the $n^-$ type semiconductor region 5. When the lower end of the conductive portion 20 is also provided in then $n^-$ type semiconductor region 5, a volume of the conductive portion 20 increases, and thus the capacitance Cmin illustrated in FIG. 3B becomes large. Therefore, in some embodiments, the lower end of the conductive portion 20 is provided in the p-type semiconductor region 6.

In some embodiments, when the lower end of the conductive portion 20 is formed in the $n^-$ type semiconductor region 5, the conductive portion 20 and the insulating layer 25 are formed in such a manner that the p-type semiconductor region 6 is not divided by the conductive portion 20 and the insulating layer 25. This is because of the p-type semiconductor region 6 is divided by the conductive portion 20 and the insulating layer 25, a portion of the p-type semiconductor region 6 is electrically separated from the anode electrode 30, and when the positive voltage is applied to the anode electrode 30, holes are not injected from the portion of the p-type semiconductor region 6 to a region where electrons are depleted and an inversion layer IL (see FIG. 3A) is not formed.

Figure 9:
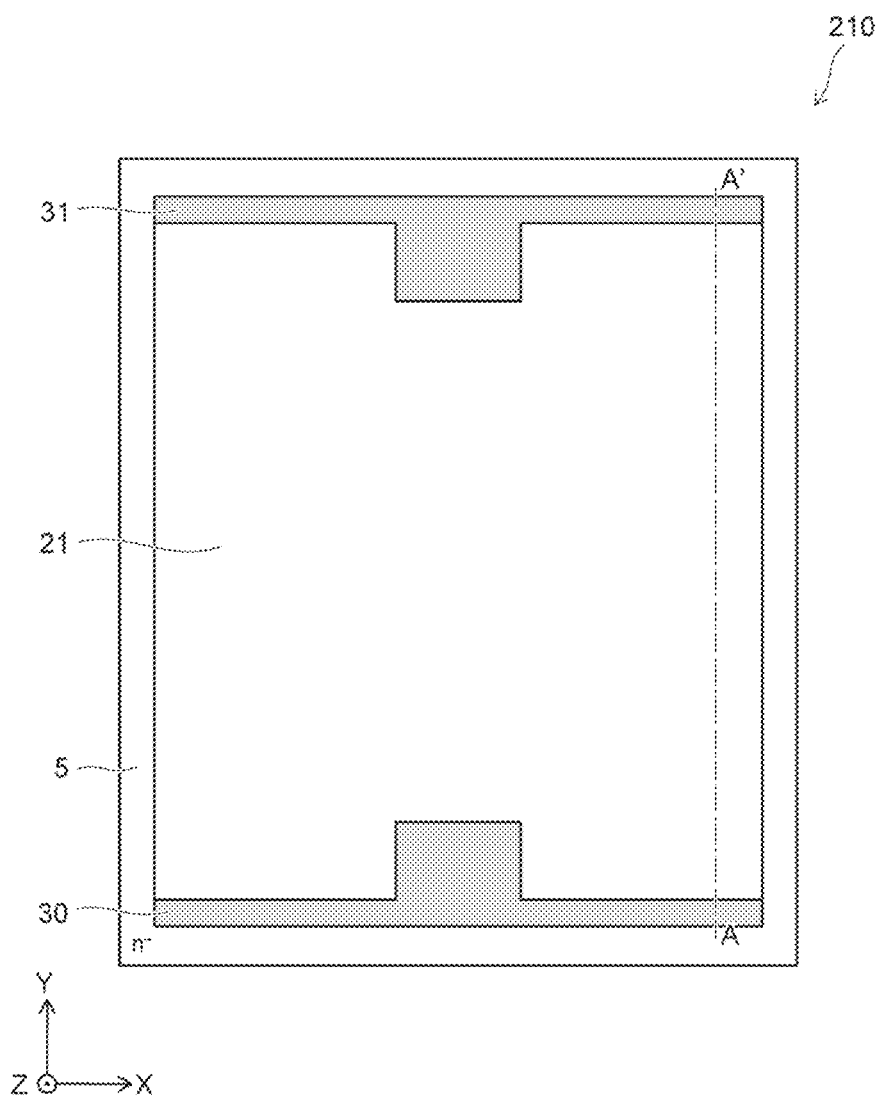
FIG. 9 is a plan view of a semiconductor device according to some embodiments.

FIG. 9 is a plan view of a semiconductor device 210 according to some embodiments.

Figure 10:
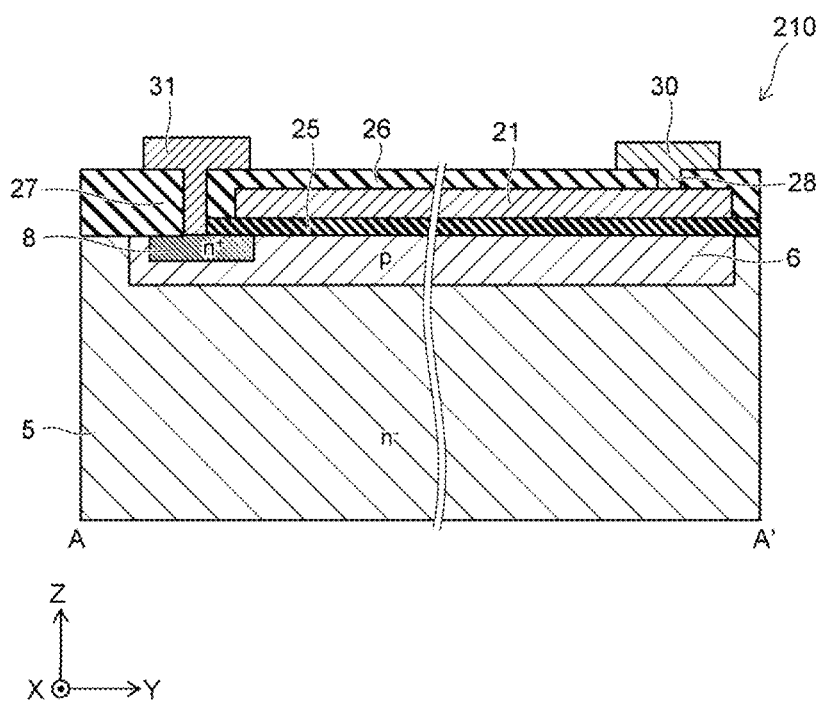
FIG. 10 is an example of a sectional view taken along line A-A' in FIG. 9.

FIG. 10 is an example of a sectional view taken along line A-A' in FIG. 9.

Figure 11:
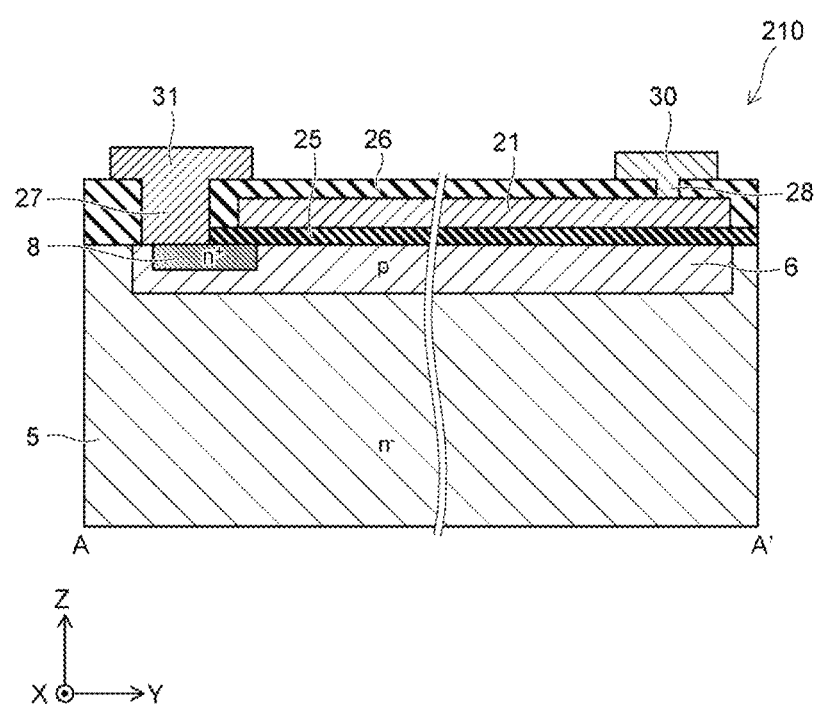
FIG. 11 is another example of a sectional view taken along line A-A' in FIG. 9.

FIG. 11 is another example of a sectional view taken along line A-A' in FIG. 9.

In FIG. 9, the insulating layer 26 is not illustrated.

In some embodiments, in the semiconductor device 210, the p-type semiconductor region 6 is provided on the n type semiconductor region 5, and an $n^+$ type semiconductor region 8 is provided on the p-type semiconductor region 6. In some embodiments, the conductive portion 21 is provided on the p-type semiconductor region 6 with the insulating layer 25 interposed (e.g., between the conductive portion 21 and the p-type semiconductor region 6). In some embodiments, the conductive portion 21 is covered with the insulating layer 26, and is electrically connected to the anode electrode 30 via the connection portion 28 formed in the insulating layer 26. The $n^+$ type semiconductor region 8 is electrically connected to the cathode electrode 31 via the connection portion 27 formed in the insulating layer 26.

In some embodiments, in the semiconductor device 210, when the voltage which is positive with respect to the cathode electrode 31 is applied to the anode electrode 30, an electron inversion layer is formed in the p-type semiconductor region 6 of the insulating layer 25. For this reason, as the voltage applied to the anode electrode 30 increases, the capacitance between the anode electrode 30 and the cathode electrode 31 can be increased, like the semiconductor device 200 (see FIG. 7 and FIG. 8).

In some embodiments, the $n^+$ type semiconductor region 8 is provided between the cathode electrode 31 and the p-type semiconductor region 6 in the example illustrated in FIG. 10. In some embodiments, the p-type semiconductor region 6 may come in direct contact with the cathode electrode 31 as illustrated in FIG. 11.

In some embodiments, as illustrated in FIG. 11, the p-type semiconductor region 6 and the cathode electrode 31 come in direct contact with each other, and thus the inversion layer IL can be formed with a lower voltage.

In some embodiments, as illustrated in FIG. 10, the p-type semiconductor region 6 and the cathode electrode 31 of the semiconductor device are connected to each other via the $n^+$ type semiconductor region 8, and the potential of the p-type semiconductor region 6 is floating, so that it is possible to reduce the capacitance Cmin illustrated in FIG. 3B.

Figure 12:
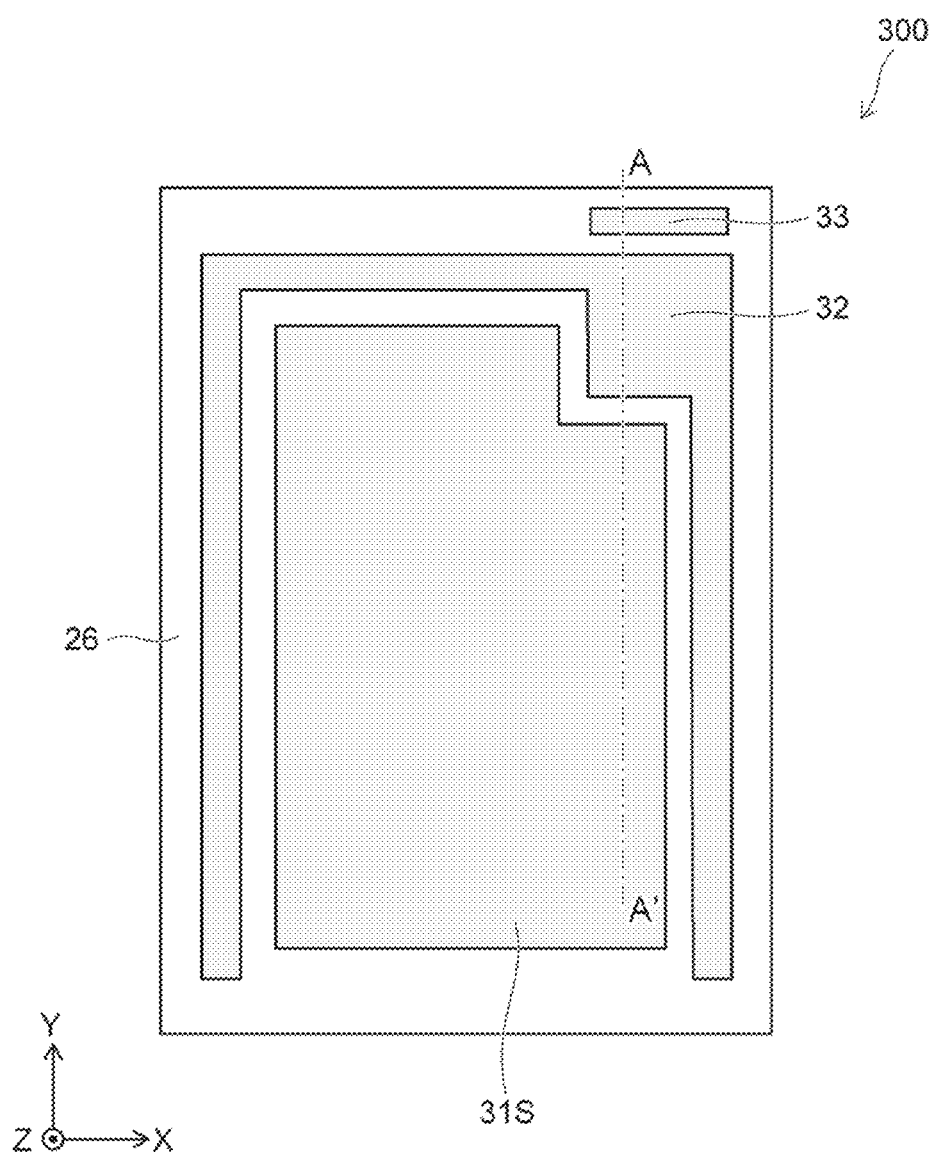
FIG. 12 is a plan view of a semiconductor device according to some embodiments.

FIG. 12 is a plan view of a semiconductor device 300 according to some embodiments.

Figure 13:
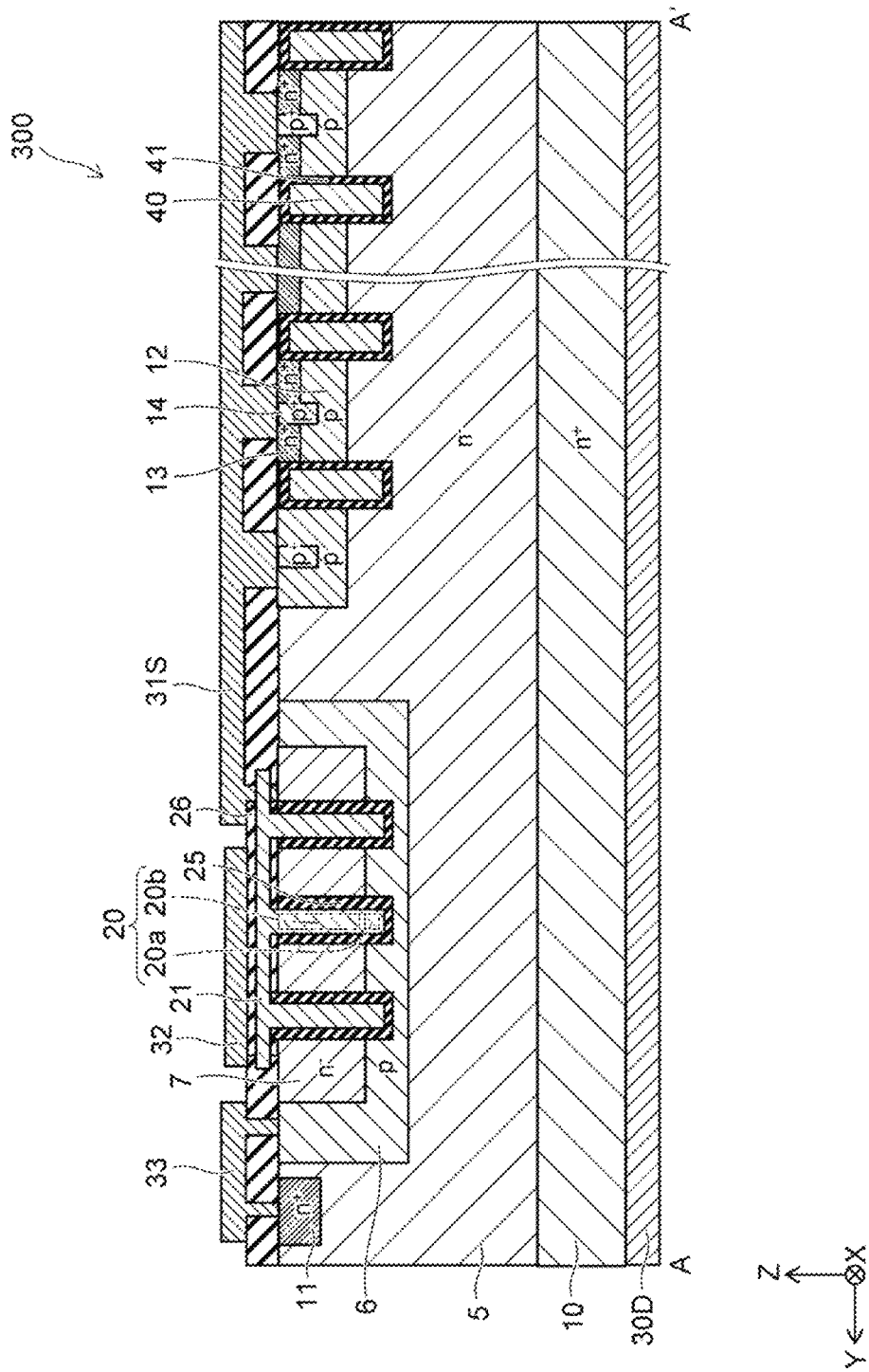
FIG. 13 is a sectional view taken along line A-A' in FIG. 12.

FIG. 13 is a sectional view taken along line A-A' in FIG. 12.

In some embodiments, as illustrated in FIG. 12 and FIG. 13, the semiconductor device 300 includes an $n^+$ type drain region 10, an $n^-$ type semiconductor region 5, a p-type semiconductor region 6, an $n^-$ type semiconductor region 7, an $n^+$ type semiconductor region 11, p-type base regions 12, $n^+$ type source regions 13, $p^+$ type contact regions 14, conductive portions 20 and 21, insulating layers 25 and 26, a drain electrode 30D, a source electrode 31S, a gate pad 32, a metal layer 33, gate electrodes 40, and a gate insulating layer 41.

In some embodiments (e.g., the embodiments illustrated in FIG. 12 and FIG. 13), a direction extending toward the p-type semiconductor region 6 from the $n^-$ type semiconductor region 5 is defined as a Z direction (e.g., as a first direction), and two directions perpendicular to the Z direction are defined as an X direction and a Y direction, which are orthogonal to each other.

In some embodiments, as illustrated in FIG. 12, the source electrode 31S, the gate pad 32, and the metal layer 33 are separated from each other on an upper surface of the semiconductor device 300. A portion of the gate pad 32 is located, for example, between the source electrode 31S and the metal layer 33.

In some embodiments, as illustrated in FIG. 13, the drain electrode 30D is provided on a lower surface of the semiconductor device 300.

In some embodiments, the $n^+$ type drain region 10 is provided on the drain electrode 30D, and is electrically connected to the drain electrode 30D.

In some embodiments, the $n^-$ type semiconductor region 5 is provided on the $n^+$ type drain region 10.

In some embodiments, a structure like the semiconductor device 200 (see FIG. 7 and FIG. 8) is provided on a portion of the n⁻ type semiconductor region 5. In some embodiments, like the semiconductor device 200, the p-type semiconductor region 6, the n⁻ type semiconductor region 7, the conductive portions 20 and 21, and the insulating layers 25 and 26 are provided.

In some embodiments, the conductive portion 21 is electrically connected to the source electrode 31S via the connection portion formed in the insulating layer 26. In some embodiments, the gate pad 32 is provided on the conductive portion 21 with interposing the insulating layer 26.

In some embodiments, the p-type semiconductor region 6 is electrically connected to the metal layer 33 via the connection portion formed in the insulating layer 26.

In some embodiments, the n⁺ type semiconductor region 11 is provided on the n⁻ type semiconductor region 5, and is separated from the p-type semiconductor region 6 and the p-type base region 12. In some embodiments, the n⁺ type semiconductor region 11 is provided to electrically connect the n⁻ type semiconductor region 5 and the p-type semiconductor region 6 to each other, and is located on an outer peripheral side of the semiconductor device 300, as compared to the p-type semiconductor region 6 and the p-type base region 12. In some embodiments, the p-type semiconductor region 6 is located between the n⁺ type semiconductor region 11 and the p-type base region 12.

In some embodiments, the n⁺ type semiconductor region 11 is electrically connected to the metal layer 33 via the connection portion formed in the insulating layer 26. That is, in some embodiments, the p-type semiconductor region 6 is electrically connected to the n⁺ type semiconductor region 11 via the metal layer 33.

In some embodiments, the p-type base region 12 is provided on the other portion of the n⁻ type semiconductor region 5.

In some embodiments, the n⁺ type source region 13 and the p⁺ type contact region 14 are selectively (or at selective locations) provided on the p-type base region 12.

In some embodiments, the gate electrode 40 is provided in the n⁻ type semiconductor region 5 and the p-type base region 12 with interposing the gate insulating layer 41, and faces the p-type base region 12 via the gate insulating layer 41. In some embodiments, the gate electrode 40 is electrically connected to the gate pad 32.

In some embodiments, the plurality of p-type base regions 12, n⁺ type source regions 13, p⁺ type contact regions 14, conductive portions 20, and gate electrodes 40 are provided in the Y direction, and extend in the X direction, respectively.

In some embodiments, the source electrode 31S is provided on the n⁺ type source region 13 and the p⁺ type contact region 14, and is electrically connected to these semiconductor regions.

In some embodiments, the insulating layer 26 is provided between the source electrode 31S and the gate electrode 40, and these electrodes are electrically isolated from each other.

An operation of the semiconductor device 300 will be described herein.

In some embodiments, when a voltage equal to or higher than a threshold value is applied to the gate electrode 40 in a state where a voltage which is positive with respect to the source electrode 31S is applied to the drain electrode 30D, an electron inversion layer may be formed on the p-type base region 12 close to the gate insulating layer 41. Thus, an MOSFET included in the semiconductor device 300 is turned on, and a current flows to the source electrode 31S from the drain electrode 30D.

Thereafter, in some embodiments, when the voltage applied to the gate electrode 40 is lower than the threshold value, the electron inversion layer is eliminated, and the MOSFET is turned off.

In some embodiments, a potential of the n⁺ type semiconductor region 11 provided in the vicinity of the outer periphery of the semiconductor device 300 may be substantially equal to that of the drain electrode 30D. Therefore, a voltage substantially equal to that of the drain electrode 30D is applied to the p-type semiconductor region 6 via the n⁺ type semiconductor region 11 and the metal layer 33. In some embodiments, when the voltage which is positive with respect to the source electrode 31S is applied to the drain electrode 30D, a hole inversion layer may be formed in the n⁻ type semiconductor region 7 close to the insulating layer 25, like the semiconductor device 200. Thus, the capacitance between the drain electrode 30D and the source electrode 31S may increase.

That is, both of MOSFET and snubber circuit are provided on the n⁻ type semiconductor region 5 in the semiconductor device 300 according to some embodiments (e.g., the embodiments illustrated in FIG. 12 and FIG. 13). As described with reference to FIG. 3C, by the connection of the snubber circuit to the MOSFET, the vibration of the drain voltage can be prevented at the time of the turning-off.

When the MOSFET and the snubber circuit are integrated on one semiconductor substrate as described above, the device can be downsized, as compared to a case where the MOSFET and the snubber circuit are formed on separate substrates and mounted in a mixed manner.

Figure 14:
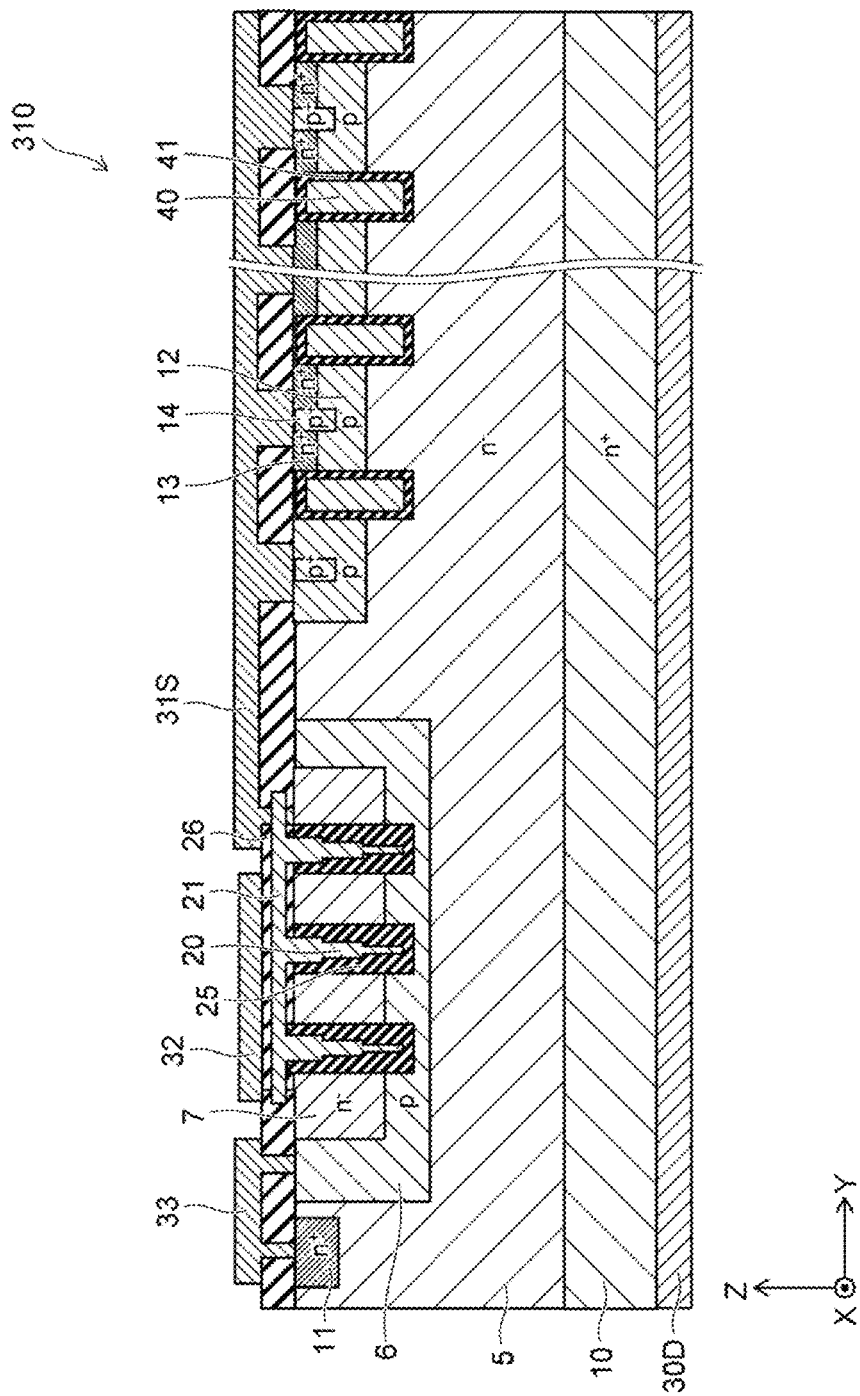
FIG. 14 is a sectional view of a semiconductor device according to some embodiments.

FIG. 14 is a sectional view of a semiconductor device 310 according to some embodiments.

The semiconductor device 310 differs from the semiconductor device 300 in terms of the structure of the insulating layer 25.

In some embodiments, in the semiconductor device 310, the insulating layer 25 between the p-type semiconductor region 6/the n⁻ type semiconductor region 7 and the conductive portion 20 is gradually thickened toward a downstream side (−Z direction). Therefore, in some embodiments, the thickness of the insulating layer 25 in the p-type semiconductor region 6 is thicker than the thickness of the insulating layer 25 in the n⁻ type semiconductor region 7. In some embodiments, as illustrated in FIG. 14, the thickness of the insulating layer 25 may be increased in a stepwise manner or may be gradually increased in a substantially continuous manner.

In some embodiments, when the voltage which is positive with respect to the source electrode 31S is applied to the drain electrode 30D and a potential difference is generated between the p-type semiconductor region 6 and the conductive portion 20, if the thickness of the insulating layer 25 is not sufficient, dielectric breakdown may occur in the insulating layer 25.

In the semiconductor device 310 according to some embodiments, since the insulating layer 25 is gradually thickened toward the downstream side, the possibility of the dielectric breakdown in the insulating layer 25 can be reduced.

Figure 15:
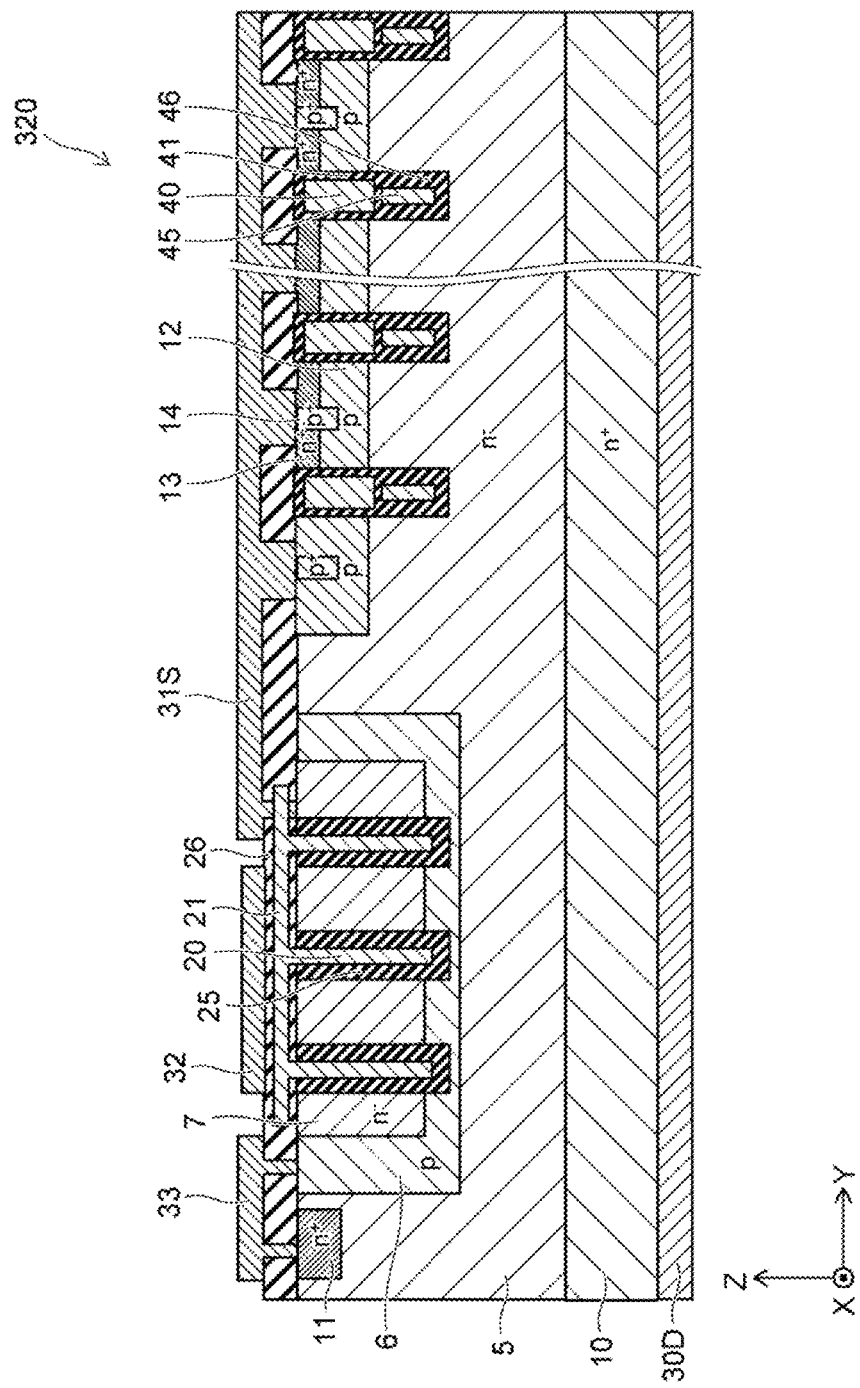
FIG. 15 is a sectional view of a semiconductor device according to some embodiments.

FIG. 15 is a sectional view of a semiconductor device 320 according to some embodiments.

The semiconductor device 320 differs from the semiconductor device 300 in that it further includes a field plate electrode (hereinafter, referred to as an "FP electrode") 45.

In some embodiments, the FP electrode 45 is provided in the n⁻ type semiconductor region 5 with interposing the insulating layer 46. In some embodiments, the thickness of the insulating layer 46 is thicker than the thickness of the gate insulating layer 41. In some embodiments, the gate electrode 40 is separately provided on the FP electrode 45. In some embodiments, the FP electrode 45 is electrically connected to the source electrode 31S or the gate pad 32.

In a manufacturing process of the semiconductor device 320 according to some embodiments, the insulating layers 25 and 46 can be formed simultaneously. For this reason, the thickness of the insulating layer 25 is equal to the thickness of the insulating layer 46, for example.

In some embodiments, when the FP electrode 45 is provided, a depletion layer may spread from a boundary between the $n^-$ type semiconductor region 5 and the insulating layer 46 to the $n^-$ type semiconductor region 5 at the time of turning-off of the MOSFET. For this reason, when the FP electrode 45 is provided, the capacitance of the semiconductor device can be largely reduced at the time of the turning-off, and lager vibration of the drain voltage may occur.

In some embodiments, when the structure like that of the semiconductor device 200 is provided, such vibration of the drain voltage can be prevented. Even in a case of preventing such large vibration of the drain voltage by the increase of the capacitance Cmax illustrated in FIG. 3B, it is possible to prevent the increase of the power loss due to the snubber circuit by reducing the capacitance Cmin.

Figure 16:
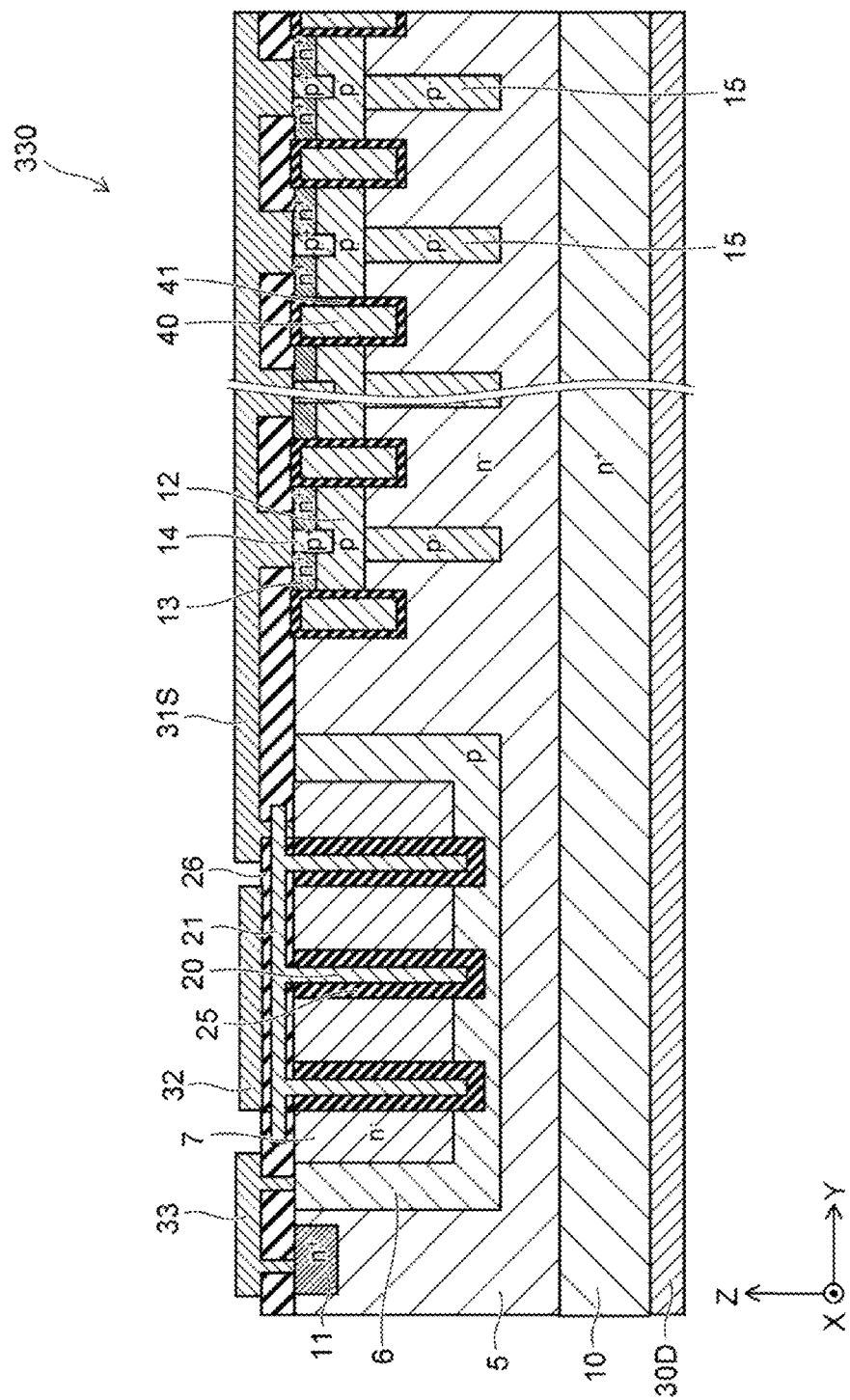
FIG. 16 a sectional view of a semiconductor device according to some embodiments.

FIG. 16 is a sectional view of a semiconductor device 330 according to some embodiments.

The semiconductor device 330 differs from the semiconductor device 300 in that the semiconductor device 330 further includes a $p^-$ type pillar region 15.

In some embodiments, the $p^-$ type pillar region 15 is provided in the $n^-$ type semiconductor region 5 and is located below the p-type base region 12. In some embodiments, the plurality of $p^-$ type pillar regions 15 are provided in the Y direction, and extend in the X direction, respectively. In some embodiments, the portion of the $n^-$ type semiconductor region 5 and the $p^-$ type pillar regions 15 are alternately provided in the X direction, so that a super junction structure is formed.

In a manufacturing process of the semiconductor device 330 according to some embodiments, for example, formation of an $n^-$ type semiconductor layer and ion implantation of a p-type impurity are alternately repeated. Thus, the p-type semiconductor region 6 and the $p^-$ type pillar region 15 can be simultaneously formed. Therefore, in some embodiments, a lower end of the p-type semiconductor region 6 and a lower end of the $p^-$ type pillar region 15 are located at the same depth, for example.

In some embodiments, when the super junction structure is provided, a depletion layer may spread from a boundary between the $n^-$ type semiconductor region 5 and the $p^-$ type pillar region 15 in the X direction at the time of turning-off of the MOSFET. For this reason, when the $p^-$ type pillar region 15 is provided, the capacitance of the semiconductor device can be largely reduced at the time of the turning-off, and lager vibration of the drain voltage may occur.

In some embodiments, like the semiconductor device 320, when the structure like that of the semiconductor device 200 is provided, such vibration of the drain voltage can be prevented.

In the embodiments described above, it is possible to confirm the relative levels of the impurity concentrations of the semiconductor regions using, for example, an SCM (Scanning Capacitance Microscope). The carrier concentration of each semiconductor region can be regarded as an impurity concentration activated in each semiconductor region. Accordingly, it is also possible to confirm the relative levels of the carrier concentrations of the semiconductor regions using the SCM.

In some embodiments, it is possible to measure the impurity concentrations of the semiconductor regions using, for example, a SIMS (Secondary Ion Mass Spectrometry).

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. From techniques of the related art, a person skilled in the art may appropriately select specific configurations of the respective components included in the embodiments, for example, the $p^+$ type semiconductor region 1, the $n^-$ type semiconductor region 2, the $n^+$ type semiconductor region 3, the $p^-$ type semiconductor region 4, the $n^-$ type semiconductor region 5, the p-type semiconductor region 6, the $n^-$ type semiconductor region 7, the $n^+$ type semiconductor region 8, the $n^+$ type drain region 10, the $n^+$ type semiconductor region 11, the p-type base region 12, the $n^+$ type source region 13, the $p^+$ type contact region 14, the $p^-$ type pillar region 15, the conductive portions 20 and 21, the insulating layers 25 and 26, the connection portions 27 and 28, the anode electrode 30, the cathode electrode 31, the gate pad 32, the metal layer 33, the gate electrode 40, and the gate insulating layer 41. The accompanying claims and their equivalents are intended to cover such forms or modifications as would fall within the scope and spirit of the present disclosure. The respective embodiments described above may be implemented by combination.

What is claimed is:

1. A semiconductor device comprising:
   an anode electrode;
   a first semiconductor region of a first conductivity type that is electrically connected to the anode electrode;
   a second semiconductor region of a second conductivity type that is provided on the first semiconductor region;
   an insulating layer;
   a conductive portion that is provided in the first semiconductor region and the second semiconductor region with the insulating layer interposed between the conductive portion and the first and second semiconductor regions; and
   a cathode electrode that is electrically connected to the conductive portion and is electrically isolated from the second semiconductor region.

2. The device according to claim 1, comprising a plurality of conductive portions including the conductive portion, wherein
   each of the conductive portions includes a first portion that faces the first semiconductor region with the insulating layer interposed between the first portion and the first semiconductor region, and a second portion that faces the second semiconductor region with the insulating layer interposed between the second portion and the second semiconductor region, and
   a length of the first portion in a first direction extending from the first semiconductor region toward the second semiconductor region is shorter than a length of the second portion in the first direction.

* * * * *